United States Patent
Liu et al.

(10) Patent No.: US 6,301,798 B1
(45) Date of Patent: Oct. 16, 2001

(54) METHOD OF MEASURING MISALIGNMENT

(75) Inventors: En-Chuan Liu, Tainen Hsien; Han-Pin Kao, Hsinchu, both of (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/328,863

(22) Filed: Jun. 9, 1999

(51) Int. Cl.$^7$ .......................... G01D 21/00; G01B 11/00
(52) U.S. Cl. ................................. 33/645; 356/401
(58) Field of Search ........................ 33/520, 613, 644, 33/645; 356/401

(56) References Cited

U.S. PATENT DOCUMENTS

| | | | |
|---|---|---|---|
| 4,037,969 | * 7/1977 | Feldman et al. | 356/401 |
| 4,356,223 | * 10/1982 | Iida et al. | 33/286 |
| 4,600,309 | * 7/1986 | Fay | 356/401 |
| 4,643,579 | * 2/1987 | Toriumi et al. | 356/401 |
| 4,708,484 | * 11/1987 | Komeyama et al. | 356/401 |
| 5,906,753 | * 5/1999 | Aoyagi et al. | 216/24 |

* cited by examiner

Primary Examiner—Randy W. Gibson
(74) Attorney, Agent, or Firm—Martine & Penilla, LLP

(57) ABSTRACT

A method of measuring a misalignment. A wafer comprising an alignment mark is provided. An outer mark with a circular shape and an outer center point is formed on the wafer. An inner mark with a circular shape and an inner center point is formed within the outer mark on the wafer. Using geometric relationship according to at least three arbitrary points on the inner and the outer marks, the inner and the outer center points are obtained. A distance between the inner and the outer points are measured. The distance indicates magnitude of the exposure misalignment.

10 Claims, 2 Drawing Sheets

US 6,301,798 B1

METHOD OF MEASURING MISALIGNMENT

BACKGROUND OF THE INVENTION

1. Field of the Invention

The invention relates to a method for measuring misalignment, and more particularly, to a method to measuring misalignment for exposure with an arc alignment mark.

2. Description of the Related Art

In the fabrication process of an integrated circuit, typically, a wafer is patterned by first transferring a pattern on a photomask to a photoresist layer via an exposure step. As the integration of the integrated circuit continuously increases, the alignment precision for the exposure step becomes more and more crucial.

In the conventional exposure step, an exposure alignment mark is formed on the wafer. While exposing the photoresist layer, a certain patterned is aligned with the exposure alignment mark, so as to precisely transfer the patterned from the photomask to a required position on the wafer. However, this kind of alignment method has error due to resolution limitation. When the fabrication process of integrated circuit approaches a submicron stage, the error is obvious to affect the quality of the wafer.

To avoid the alignment error to affect the product yield during the exposure step, currently, an exposure step is performed on a wafer among a batch of wafers (normally 25 wafers), followed by measuring misalignment on different positions of the wafer. A modification for exposure is then calculated on the other wafers in the same batch.

FIG. 1A shows a top view of a conventional structure to measuring misalignment for exposure.

In FIG. 1A, a wafer 100 comprises exposure alignment marks 102 and an outer layer mark 104. The outer layer mark 104 is arranged as a rectangle as shown in the figure. The outer layer mark 104 by formed by four trenches 104a, 104b, 104c and 104d. The wafer 100 further comprises an inner layer mark 106 made of photoresist. The inner layer mark 106 is formed by forming a photoresist layer on the wafer 100 first, followed by exposure and development steps using a certain pattern on the exposure alignment marks to confirm the position of the wafer 100. As a result, the inner layer mark 106 has a rectangular shape and arranged within the rectangle of the outer layer mark 104. Similarly, the inner mark 106 comprises four strip structures 106a, 106b, 106c and 106d.

The inner layer mark 106 is predetermined to be formed in the center of the outer layer mark 104. Each of the strip structures 106a to 106d is supposed to be equally distant to a corresponding trench of the trenches 104a to 104b. However, as misalignment occurs for exposure, the inner layer mark 106 deviates the central position of the outer layer mark 104. The level of the deviation indicates the magnitude of misalignment for the wafer 100 beyond this region.

To introduce the conventional inspecting method of the misalignment in more details, in the following description, the horizontal direction is denoted as an X-axis, while the vertical direction is denoted as Y-direction as shown in FIG. 1A. A first measuring line 108 is selected parallel to the X-axis. The first measuring line intersects with the trenches 104a and 104c at $A_1$ and $A_4$, and intersects with the strip structures 106a and 106c at $A_2$ and $A_3$, respectively. The X-coordinates for $A_1$, $A_2$, $A_3$ and $A_4$ are $X_1$, $X_2$, $X_3$ and $X_4$. A difference between a mean value of $X_1$ and $X_4$ and a mean value of $X_2$ and $X_3$ represents misalignment along the X-axis.

A second measuring line 110 is selected to be parallel to Y-axis. The same method is used to obtain a misalignment along the Y-axis. The misalignment as a form of displacement can thus be obtained and modified.

However, while a circular misalignment occurs as shown in FIG. 1B, each side of the inner layer mark 106 and a corresponding side of the outer layer mark 104 meets at an angle. The parallel relationship is not sustained any more. Therefore, using the above method, the misalignment is variable according to the location of the measuring lines. For example, in FIG. 1B, the misalignments obtained by measuring lines 112 and 114 are in different magnitude. This is the same for the measuring lines in vertical Y-direction. Thus, the calculated modification for exposure of the wafers is not correct. The incorrect modification thus causes the pattern to be transferred from the photomask to the wafers with a distortion.

On the other hand, before performing the exposure on the photoresist layer over the wafer, deposition steps are very often performed on the wafer. Some depositions are thus remained within the trenches of 104. Though the trenches 104 are not filled thereby, in case that the deposition is not formed uniformly or is formed with defects, it would cause the outer layer mark 104 out of position to further cause the system fails to inspect the misalignment for exposure.

SUMMARY OF THE INVENTION

The invention provides a method for inspecting misalignment for exposure. An outer circular mark is formed on a wafer comprising an exposure alignment mark thereon. The outer circular mark has an central point. A photoresist layer is formed on the wafer. An exposure step is performed by aligning a certain pattern of the photomask with of the exposure alignment mark. A development step is performed to form an inner circular mark. The inner circular mark and the outer circular mark are concentric. However, since a misalignment might happen, in practical application, the central point of the outer circular mark and the inner circular point may not overlap. The central point of the inner circular mark is named the inner center, while the central point of the outer circular mark is named as the outer center.

By selecting some points on the outer circular mark, the outer center point can be obtained by a geometric method. Similarly, the inner center can be obtained. The difference between the inner center point and the outer center point indicates the magnitude of the exposure misalignment.

After obtaining the magnitude of exposure misalignment, a modification can be applied to the exposure step for wafers.

The invention further provides an aligning structure. The structure comprises a exposure alignment mark, an outer mark and an inner mark on a wafer. The inner and the outer mark have an inner circle and an outer circle, respectively. The inner circle has an inner center, and the outer circle has an outer center. The inner circle is within the outer circle.

With the circular geometry of both the inner and outer marks, measuring lines are not required. Apart from the misalignment for displacement, circular misalignment can also be measured. In addition, more points can be selected on the inner and the outer circles to obtain a more precise positions of the inner center and the outer center. The obtained magnitude of misalignment can be further more exact. Therefore, those problems caused by uniform depositions or depositions with defects within the outer mark can be overcome.

It is to be understood that both the foregoing general description and the following detailed description are exemplary and explanatory only and are not restrictive of the invention, as claimed.

DESCRIPTION OF THE PREFERRED EMBODIMENTS

Figure 1A:
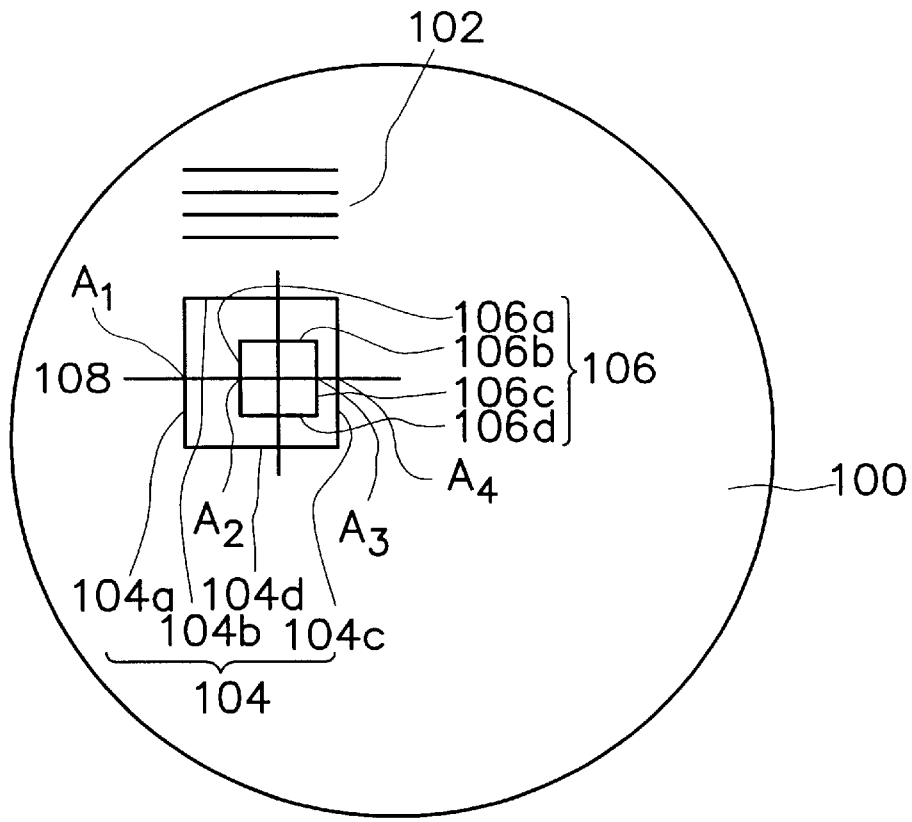
FIG. 1A shows a top view of a conventional structure for measuring a misalignment.
Figure 1B:
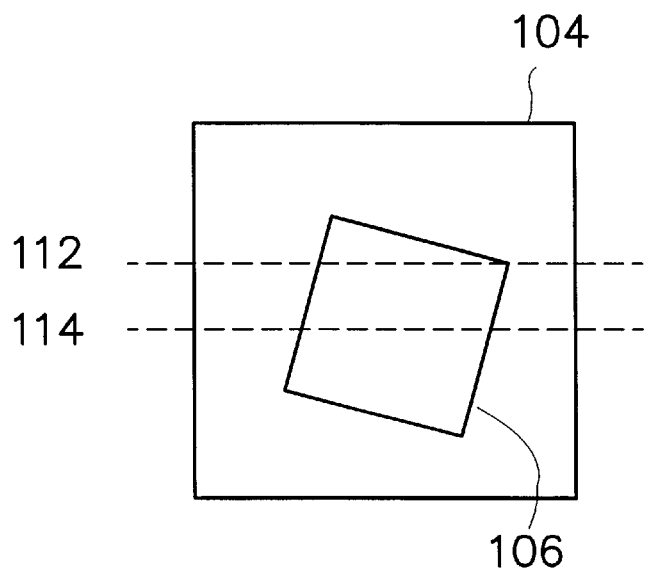
FIG. 1B illustrates conventional circular misalignment.
Figure 2:
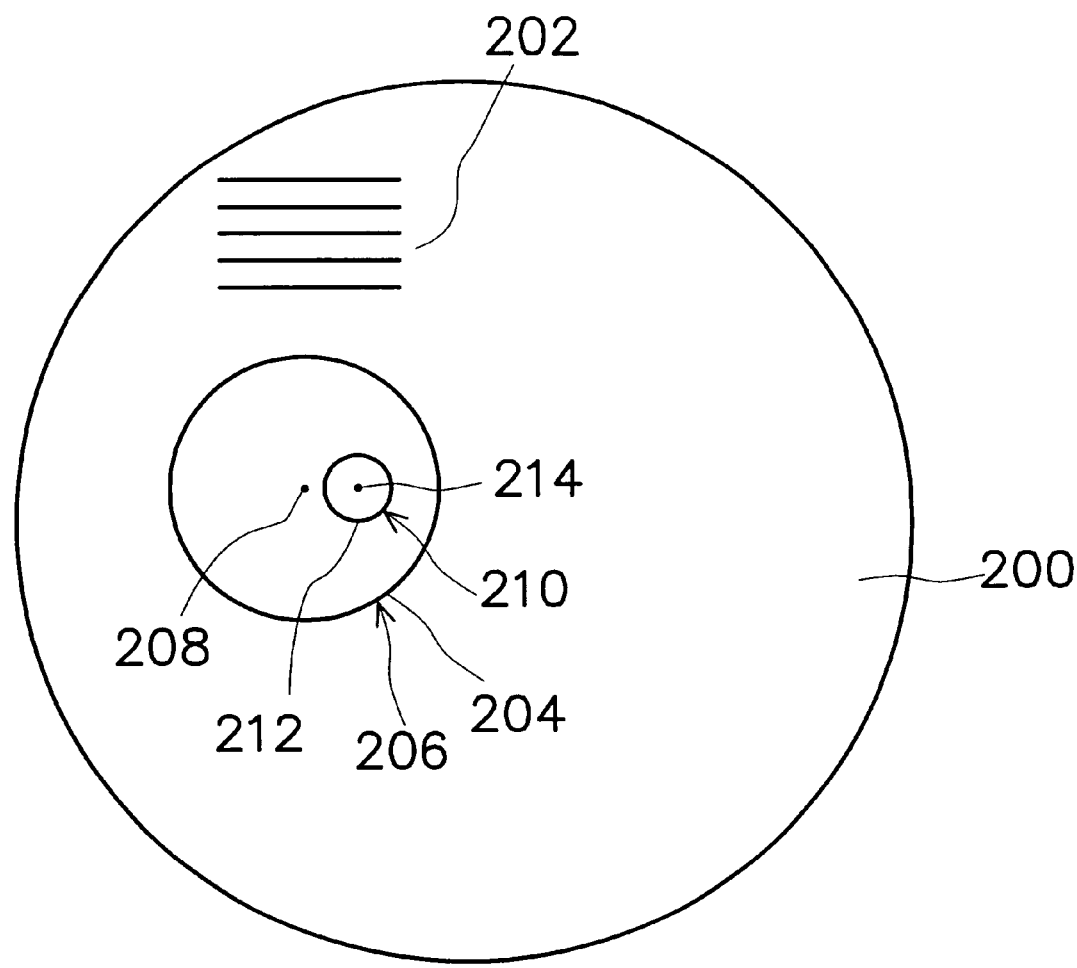
FIG. 2 is a top view of a structure for measuring an exposure misalignment.

In FIG. 2, a wafer 200 comprising an exposure alignment mark 202 is provided. An outer mark 204 is formed on the wafer 200. The outer mark 204 has a circular trench 206 with a center point 208. Alternatively, the outer mark 204 can only be a section of a circumference of a circle. A photoresist layer is formed on the wafer. By aligning the alignment mark 202 with a certain pattern on a photomask, steps of exposure and development are performed. An inner mark 212 is formed within the outer mark 204 on the wafer 200. The material for forming the inner mark 212 is, for example, photoresist. Similarly, the inner mark 212 can be an inner circle 210 or only a segment of a circumference of a circle with a center point 214. When the certain patterned of the photomask is exactly aligned with the exposure alignment mark 202, the inner center point 214 overlaps with the outer center point 208. On the contrary, when misalignment occurs, the inner center point 214 deviates from the outer center point 208 with a distance. The distance indicates the magnitude of the misalignment.

By selecting at least three points on the circular trench 206, the outer center point 208 can be calculated by a geometric method. Similarly, by selecting at least three points on the inner circle 210, the inner center point 214 can be obtained. The distance between the inner center and the outer center points can then be measured.

By the method mentioned as above, certain points on the wafer can be used to obtain the aligning deviation. According to the aligning deviation, a modification can be calculated for the further exposure performed on the wafers.

In the invention, instead of measuring deviation along X-direction and Y-direction respectively to obtain the magnitude of misalignment, a method of forming circular inner and outer marks is used. The center points of both the inner and outer marks can be obtained by selecting three or more arbitrary points on the circles according to a geometric method. As a consequence, both the displacement and circular misalignment can be measured.

When more than three points are selected to determine the inner and the outer center points, the locations of the inner and the outer center points can be calculated more precisely. The problems caused by the uniform deposition or deposition with defects can thus be resolved.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of measuring a misalignment, comprising:
   providing a wafer comprising an exposure alignment mark thereon;
   forming an outer mark on the wafer, the outer mark comprising an outer circular segment;
   forming an inner mark on the wafer, the inner mark comprising an inner circular segment within the outer circular segment, and the inner mark being a pattern transferred into the wafer through a photomask using a photolithography process;
   obtaining an inner center point of the inner circular segment and an outer center point of the outer circular segment; and
   measuring a distance between the inner and the outer center points.

2. The method according to claim 1, wherein the outer circular segment comprises a circular trench.

3. The method according to claim 1, wherein the inner circular segment comprises a circle.

4. The method according to claim 1, wherein the inner mark is formed by:
   forming a photoresist layer on the wafer;
   alignment a pattern of a photomask with the alignment mark on the wafer; and
   performing steps of exposure and development.

5. The method according to claim 1, wherein the outer center point is obtained by:
   selecting at least three points on the outer circular segment; and
   calculating the outer center point according to geometric method.

6. The method according to claim 1, wherein the inner center point is obtained by:
   selecting at least three points on the inner circular segment; and
   calculating the inner center point according to geometric method.

7. The method according to claim 1, wherein the distance between the inner center point and the outer center point indicates the magnitude of the misalignment.

8. The method according to claim 1, comprising further a step of performing exposure on other wafers with a modification of the misalignment.

9. A method for measuring misalignment between a patterned mask and a wafer, comprising:
   providing a wafer with exposure alignment marks;
   forming an outer mark on the wafer, the outer mark comprising an outer circular shape;
   aligning a patterned mask with the wafer through the exposure alignment marks;
   forming an inner mark on the wafer through the patterned mask, the inner mark comprising an inner circular shape;
   obtaining an outer center point of the outer circular mark and an inner center point of the inner circular mark through at least three points located on the respective circular marks; and
   measuring a distance between the outer center point and the inner center point to define quantitatively a misalignment between the patterned mask and the wafer.

10. The method of claim 9, wherein the inner mark is a pattern transferred into the wafer through a photomask using a photolithography process.

* * * * *